(12) United States Patent
Choi et al.

(10) Patent No.: US 10,599,378 B2
(45) Date of Patent: Mar. 24, 2020

(54) DISPLAY DEVICE

(71) Applicant: SAMSUNG DISPLAY CO., LTD., Yongin-si, Gyeonggi-do (KR)

(72) Inventors: Jin Hwan Choi, Seoul (KR); Bo Ik Park, Uiwang-si (KR); Tae An Seo, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 232 days.

(21) Appl. No.: 15/591,495

(22) Filed: May 10, 2017

(65) Prior Publication Data
US 2017/0329567 A1  Nov. 16, 2017

(30) Foreign Application Priority Data
May 11, 2016 (KR) .................. 10-2016-0057653

(51) Int. Cl.
  *G06F 3/14* (2006.01)
  *G06F 1/16* (2006.01)
  *H05K 5/00* (2006.01)
  *H05K 5/02* (2006.01)

(52) U.S. Cl.
  CPC .......... *G06F 3/1423* (2013.01); *G06F 1/1641* (2013.01); *G06F 3/1446* (2013.01); *H05K 5/0017* (2013.01); *H05K 5/0021* (2013.01); *H05K 5/0217* (2013.01); *G09G 2300/026* (2013.01)

(58) Field of Classification Search
None
See application file for complete search history.

(56) References Cited

U.S. PATENT DOCUMENTS

| 8,576,555 | B2 | 11/2013 | Misawa | |
| 9,173,287 | B1* | 10/2015 | Kim | H05K 1/028 |
| 2010/0277665 | A1* | 11/2010 | Kuo | G02F 1/13336 |
| | | | | 349/58 |
| 2012/0044620 | A1* | 2/2012 | Song | G06F 1/1616 |
| | | | | 361/679.01 |
| 2012/0113614 | A1* | 5/2012 | Watanabe | G02F 1/13336 |
| | | | | 361/810 |

(Continued)

FOREIGN PATENT DOCUMENTS

| KR | 10-2010-0092222 A | 8/2010 |
| KR | 10-2011-0028893 A | 3/2011 |
| KR | 10-1329946 B1 | 11/2013 |

*Primary Examiner* — Stephen T. Reed
(74) *Attorney, Agent, or Firm* — Kile Park Reed & Houtteman PLLC (57) ABSTRACT

A display device includes first and second display panel having respective first and second display areas to display an image, a first support portion to support the first display panel, the first support portion having a curved first end portion and being rotatable based on a first rotation shaft, and a second support portion to support the second display panel, the second support portion having a curved second end portion facing the first end portion, and the second support portion being rotatable based on a second rotation shaft parallel to the first rotation shaft. The first display area covers at least some of an outer surface of the first end portion of the first support portion, and the second display area covers at least some of an outer surface of the second end portion of the second support portion.

19 Claims, 11 Drawing Sheets

(56) References Cited

U.S. PATENT DOCUMENTS

2015/0257289 A1* 9/2015 Lee ................... H05K 5/0017
361/749
2017/0031386 A1* 2/2017 Engel .................. G06F 3/1446

* cited by examiner

FIG. 11 ental design the display device.

DISPLAY DEVICE

CROSS-REFERENCE TO RELATED APPLICATION

Korean Patent Application No. 10-2016-0057653, filed on May 11, 2016, in the Korean Intellectual Property Office, and entitled: "Display Device," is incorporated by reference herein in its entirety.

BACKGROUND

1. Field

The present disclosure relates to a display device.

2. Description of the Related Art

Currently, as generally known display devices, there are a liquid crystal display (LCD), a plasma display panel (PDP), an organic light emitting diode (OLED) display, a field effect display (FED), an electrophoretic display, and the like.

For example, the OLED display includes two electrodes and an organic emission layer interposed therebetween. Electrons injected from one electrode and holes injected from the other electrode are combined in the organic emission layer to generate excitons, and the generated excitons release energy to emit light. The OLED display may have a reduced thickness and weight since it has a self-luminance characteristic and does not require an additional light source, unlike the LCD. In addition, the OLED display is receiving attention as a next generation display device since it has high quality characteristics, e.g., low power consumption, high luminance, and high response speed.

SUMMARY

An exemplary embodiment provides a display device including a first display panel including a first display area for displaying an image; a second display panel including a second display area for displaying an image; a first support portion that supports the first display panel and is rotatable based on a first rotation shaft, and of which a first end portion is curved; and a second support portion that supports the second display panel and is rotatable based on a second rotation shaft parallel to the first rotation shaft, and of which a second end portion facing the first end portion is curved, wherein the first display area of the first display panel may cover at least some of an outer surface of the first end portion of the first support portion, and the second display area of the second display panel may cover at least some of an outer surface of the second end portion of the second support portion.

The first support portion may include a first flat portion having a flat outer surface and a first curved portion that is disposed at a first side of the first flat portion and has a curved outer surface, and the first display area may cover the outer surfaces of the first flat portion and the first curved portion.

The first display area may cover a half of or less than the outer surface of the first curved portion.

The first display panel may include a first peripheral area that is disposed around the first display area and covers at least some of the outer surface of the first curved portion, and a plurality of first signal lines configured to transmit a signal to the first display area may be disposed in the first peripheral area.

The second support portion may include a second flat portion having a flat outer surface and a second curved portion that is disposed at a first side of the second flat portion and has a curved outer surface facing the first curved portion, and the second display area may cover the outer surfaces of the second flat portion and the second curved portion.

The second display area may cover a half of or less than the outer surface of the second curved portion.

The second display panel may include a second peripheral area that is disposed around the second display area and covers at least some of the outer surface of the second curved portion, and a plurality of second signal lines configured to transmit a signal to the second display area may be disposed in the second peripheral area.

The outer surfaces of the first curved portion and the second curved portion may be curved to have a predetermined curvature radius.

The curvature radius may be equal to or less than 5 mm (excluding 0 mm).

When viewed from a plane, a distance between the first display area and the second display area may be equal to or less than about 2 mm.

Each thickness of the first display panel and the second display panel may be about 0.1 to 1 mm.

The display device may further include a spacer that is coupled to the first rotation shaft and the second rotation shaft and constantly maintains a distance between the first rotation shaft and the second rotation shaft.

The spacer may be disposed on each lateral surface of the first support portion and the second support portion.

An adhesive film may be respectively interposed between the first display panel and the first support portion, and between the second display panel and the second support portion.

The adhesive film may be a double-sided adhesive tape.

The display device may further include: a third display panel including a third display area for displaying an image; and a third support portion that supports the third display panel and is rotatable based on a fourth rotation shaft parallel to a third rotation shaft, wherein the third rotation shaft may be disposed at the second support portion to be parallel to the second rotation shaft, a fourth end portion of the third support portion facing a third end portion of the second support portion disposed at the other side of the second end portion may be curved, and the third display area of the third display panel may cover at least some of the outer surface of the fourth end portion of the third support portion.

The display device may further include a fourth display panel including a fourth display area for displaying an image; and a fourth support portion that supports the fourth display panel and is rotatable based on a sixth rotation shaft parallel to a fifth rotation shaft, wherein the fifth rotation shaft may be disposed at the third support portion to be parallel to the fourth rotation shaft, a sixth end portion of the fourth support portion facing a fifth end portion of the third support portion disposed at the other side of the fourth end portion may be curved, and the fourth display area of the fourth display panel may cover at least some of the outer surface of the sixth end portion of the fourth support portion.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In addition, unless explicitly described to the contrary, the word "comprise" and variations such as "comprises" or "comprising" will be understood to imply the inclusion of stated elements but not the exclusion of any other elements. Further, in the specification, the word "on" means positioned on or below the object portion, and does not necessarily mean positioned on the upper side of the object portion based on a gravitational direction.

Hereinafter, a display device according to an exemplary embodiment will be described with reference to FIG. 1 to FIG. 3.

Figure 1:
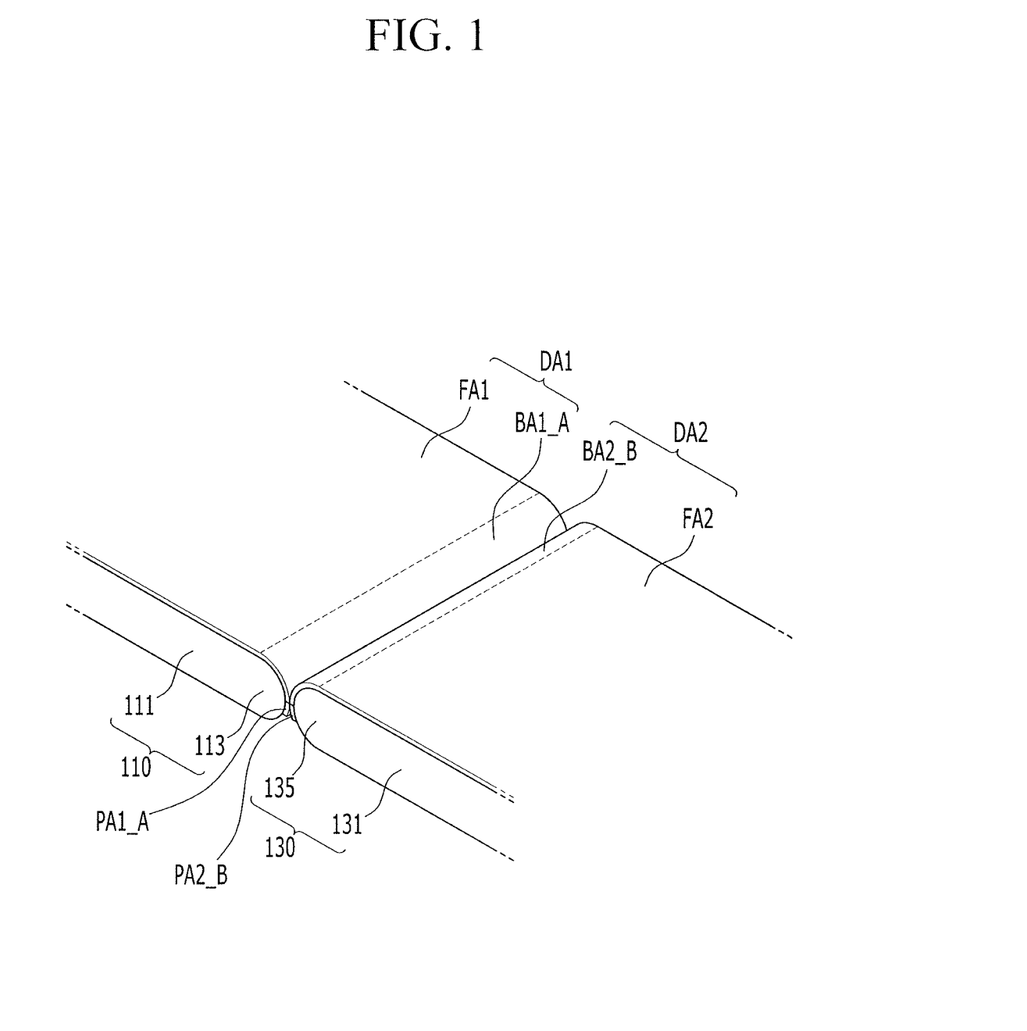
FIG. 1 illustrates a schematic perspective view of a display device according to an exemplary embodiment.
Figure 2:
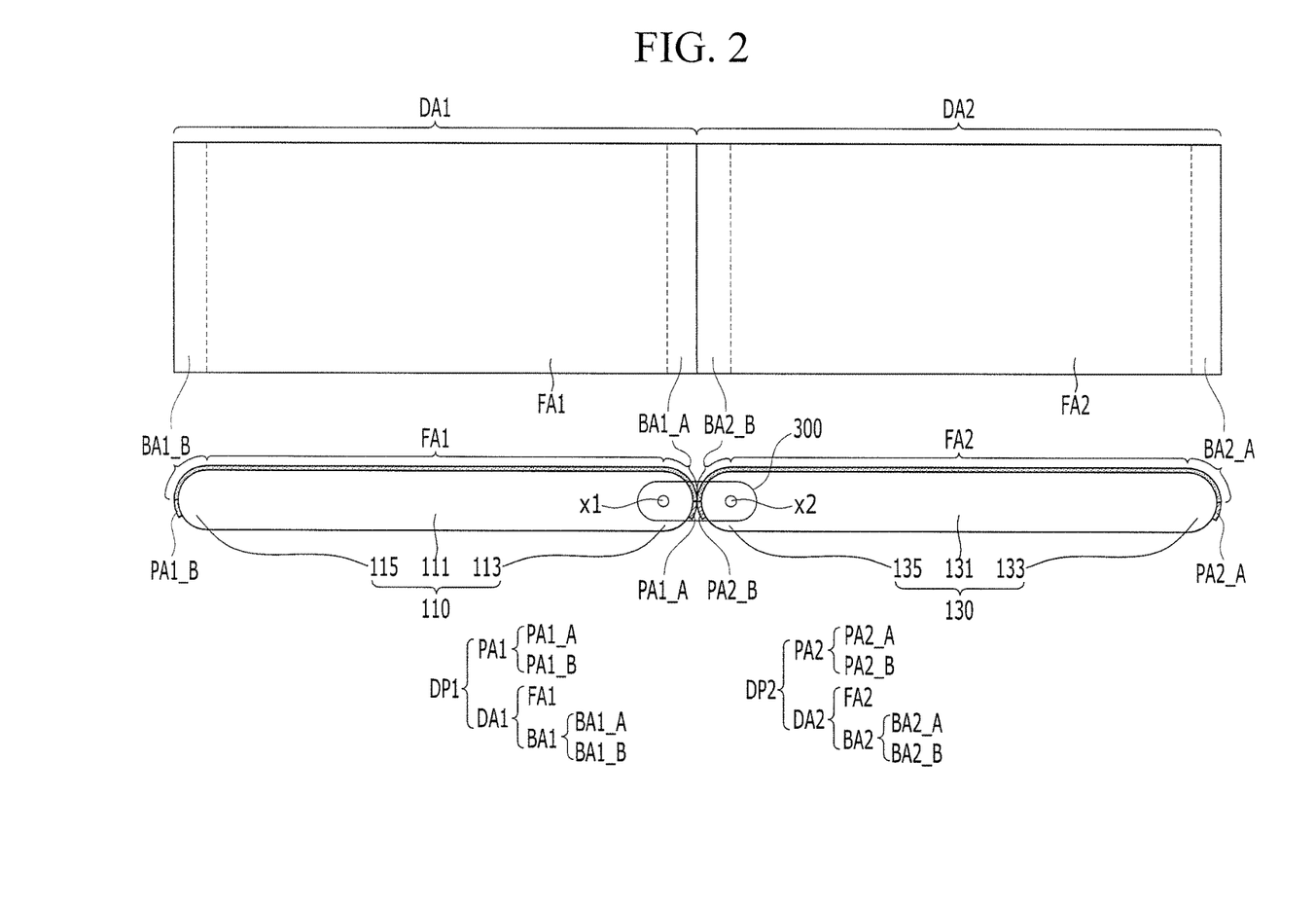
FIG. 2 illustrates a top plan view and a side view of a display device according to an exemplary embodiment.
Figure 3:
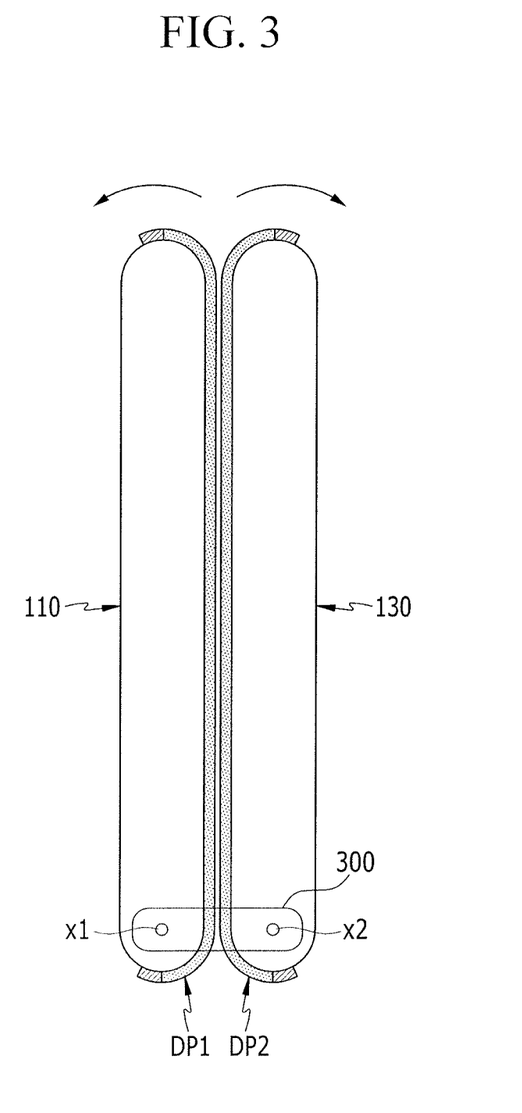
FIG. 3 illustrates a state in which a first support portion and a second support portion of FIG. 1 are folded.

FIG. 1 illustrates a schematic perspective view of a portion of a display device according to an exemplary embodiment, FIG. 2 illustrates a top plan view and a side view of a display device according to an exemplary embodiment, and FIG. 3 illustrates a state in which a first support portion and a second support portion of FIG. 1 are folded.

Referring to FIG. 1 and FIG. 2, a display device of the present exemplary embodiment may include a first display panel DP1, a second display panel DP2, a first support portion 110, and a second support portion 130. In the present exemplary embodiment, the first display panel DP1 and the second display panel DP2 included in one, e.g., same, display device are respectively disposed on the first support portion 110 and the second support portion 130. The first support portion 110 and the second support portion 130 respectively rotate based on a first rotation shaft X1 and a second rotation shaft X2, which are parallel to each other, thus a foldable display device or a rollable display device may be realized.

The first display panel DP1 and the second display panel DP2 emit light to display an image, respectively. In this case, the first display panel DP1 and the second display panel DP2 may be display panels that are used in the OLED display, the LCD, the PDP, the FED, the electrophoretic display, etc. For example, the first and second display panels DP1 and DP2 may be arranged adjacent to each other to display together a combined single image, e.g., each of the first and second display panels DP1 and DP2 display a different portion of the combined single image.

The first display panel DP1 disposed on the first support portion 110 may include a first display area DA1 and first peripheral areas PA1. The first display area DA1 displays an image, and may be divided into a first flat area FA1 and first bending areas BA1.

The first flat area FA1 is disposed on a first flat portion 111 of the first support portion 110 described later, and has a flat surface. The first bending areas BA1 are disposed on first curved portions 113 and 115 of the first support portion 110. The first bending areas BA1 are formed to correspond to shapes of the first curved portions 113 and 115. The first bending areas BA1 may be respectively disposed at opposite sides of the first flat area FA1, e.g., a left side and a right side of the first flat area FA1 of FIG. 2. That is, the first bending area BA1 may be divided into a first bending area (BA1_A) disposed on the first curved portion 113 and a first bending area (BA1_B) disposed on the first curved portion 115.

The first peripheral areas PA1 are disposed around the first display area DA1, and a driving signal line, a driver, etc. for driving the first display area DA1 may be disposed in the first peripheral areas PA1. The first peripheral areas PA1 are disposed at opposite sides of the first display area DA1, and may include a first peripheral area (PA1_A) disposed at a right side of the first bending area (BA1_A) and a first peripheral area (PA1_B) disposed at a left side of the first bending area (BA1_B). In the present exemplary embodiment, although it is described that the first peripheral areas PA1 are disposed at the left and right sides, i.e., at opposite sides of the first display area DA1, the present disclosure is not limited thereto, and the first peripheral area PA1 may be disposed at only one of the left and right sides of the first display area DA1. In the present exemplary embodiment, the first bending areas (BA1_A, BA1_B) and the first peripheral areas (PA1_A, PA1_B) are disposed on the first curved portions 113 and 115 of the first support portion 110.

The second display panel DP2 may be disposed on the second support portion 130 adjacent to the first support portion 110. The second display panel DP2 may include a second display area DA2 and second peripheral areas PA2. Similar to the first display area DA1, the second display area DA2 displays an image, and may be divided into a second flat area FA2 and second bending areas BA2.

The second flat area FA2 is disposed on a second flat portion 131 of the second support portion 130 described later, and has a flat surface. The second bending areas BA2 are disposed on second curved portions 133 and 135 of the second support portion 130. The second bending areas BA2 are formed to correspond to shapes of the second curved portions 133 and 135. The second bending areas BA2 may be respectively disposed at opposite sides of the second flat area FA2, e.g., at a left side and a right side of the second flat area FA2 of FIG. 2. That is, the second bending area BA2 may be divided into a second bending area (BA2_A) disposed on the second curved portion 133 and a second bending area (BA2_B) disposed on the second curved portion 135.

The second peripheral areas PA2 are disposed around the second display area DA2, and as in the first peripheral areas PA1, a driving signal line, a driver, etc. for driving the first display area DA2 may be disposed in the second peripheral areas PA2. The second peripheral areas PA2 are disposed at opposite sides of the second display area DA2, and may include a second peripheral area (PA2_A) disposed at a right side of the second bending area (BA2_A) and a second peripheral area (PA2_B) disposed at a left side of the second bending area (BA2_B). For example, in the present exemplary embodiment, the second bending areas (BA2_A, BA2_B) and the second peripheral areas (PA2_A, PA2_B) are disposed on the second curved portions 133 and 135 of the second support portion 130. Similar to the first peripheral areas PA1, the second peripheral area PA2 may be disposed only at one of the left and right sides of the second display area DA2. In this case, each thickness of the first display panel DP1 and the second display panel DP2 may be about 0.1 mm to about 1 mm.

According to the present exemplary embodiment, the first support portion 110 may support the aforementioned first display panel DP1. The first support portion 110 may include the first flat portion 111 and the first curved portions 113 and 115.

The first flat portion 111 is disposed at a central portion of the first support portion 110, and an outer flat surface of the first flat portion 111 contacting the first display panel DP1 is formed to be flat. As the outer surface of the first flat portion 111 is flat, a surface of the first flat area FA1 of the first display panel DP1 supported by the first flat portion 111 may also be flat.

The first curved portions 113 and 115 correspond to areas of opposite sides of first flat portion 111, e.g., a left side area and a right side area of the first flat portion 111 of FIG. 2. In the present exemplary embodiment, although it is described that the first curved portions 113 and 115 are respectively disposed at the opposite sides of the first flat portion 111, the present disclosure is not limited thereto, and the first curved portions may be disposed at only one of the left and right sides of the first flat portion 111.

Outer surfaces of the first curved portions 113 and 115 contacting the first display panel DP1 may be formed to have a curved shape. In this case, each of the first curved portions 113 and 115 is formed to be convex in a lateral side of the first flat portion 111. In detail, the first curved portion 113 is formed to be convex in a rightward direction from a center of the first flat portion 111. The first curved portion 115 is formed to be convex in a leftward direction from a center of the first flat portion 111.

In this case, the first curved portions 113 and 115 may be formed to have a curved shape with a predetermined curvature radius (R). For example, outer surfaces of the first curved portions 113 and 115 may be formed to have a semi-circular shape. In this case, the curvature radius (R) of the first curved portions 113 and 115 may be equal to or less than 5 mm but larger than 0 mm.

In the present exemplary embodiment, the first display area DA1 may cover at least some of the outer surfaces of the first curved portions 113 and 115. For example, the first bending area (BA1_A) of the first display area DA1 may cover at least some of the outer surface of the first curved portion 113. In addition, the first bending area (BA1_B) of the first display area DA1 may cover at least some of the outer surface of the first curved portion 115. A disposition relationship of the first bending area (BA1_A, BA1_B) and the first curved portions 113 and 115 will be described later.

The first support portion 110 may be made of a rigid material that can firmly support the first display panel DP1 so that a shape of the first display panel DP1 is not deformed. For example, the first support portion 110 may be made of plastic, metal, wood, and the like.

The second support portion 130 may support the aforementioned second display panel DP2. The first support portion 110 is rotatable based on the first rotation shaft X1, and the second support portion 130 is rotatable based on the second rotation shaft X2 parallel to the first rotation shaft X1, e.g., the first and second support portions 110 and 130 may be rotatable independently of each other. For example, as illustrated in FIG. 2, the first and second rotation shafts X1 and X2 may extend through facing edges of the first and second support portions 110 and 130, respectively. As such, the first and second support portions 110 and 130 may rotate on the first and second rotation shafts X1 and X2, respectively, toward each other or away from each other. As such, since the first support portion 110 and the second support portion 130 may be respectively rotated based on the first rotation shaft X1 and the second rotation shaft X2, the first display panel DP1 and the second display panel DP2 respectively disposed on the first support portion 110 and the second support portion 130 may be used to realize the foldable display device.

The second support portion 130 may include the second flat portion 131 and the second curved portions 133 and 135. The second flat portion 131 is disposed at a central portion of the second support portion 130, and an outer flat surface of the second flat portion 131 contacting the second display panel DP2 is formed to be flat. As the outer surface of the second flat portion 131 is flat, a surface of the second flat area FA2 of the second display panel DP2 supported by the second flat portion 131 may also be flat.

The second curved portions 133 and 135 correspond to areas of opposite sides of second flat portion 131, e.g., a left side area and a right side area of the second flat portion 131. The second curved portion 135 of the second support portion 130 may be disposed to face the first curved portion 113 of the first support portion 110. In the present exemplary embodiment, although it is described that the second curved portions 133 and 135 are respectively disposed at opposite sides of the second flat portion 131, the present disclosure is not limited thereto, and the second curved portions may be disposed at only one of the left and right sides of second flat portion 131.

Outer surfaces of the second curved portions 133 and 135 contacting the second display panel DP2 may be formed to have a curved shape. In this case, each of the second curved portions 133 and 135 is formed to be convex in a lateral side of the second flat portion 131. In detail, the second curved portion 133 is formed to be convex in a rightward direction from a center of the second flat portion 131. The second curved portion 135 is formed to be convex in a leftward direction from a center of the second flat portion 131.

The second curved portions 133 and 135, similar to the first curved portions 113 and 115, may be formed to have a curved shape with a predetermined curvature radius (R). For example, outer surfaces of the second curved portions 133 and 135 may be formed to have a semi-circular shape. In this case, the curvature radius (R) of the second curved portions 133 and 135 may be equal to or less than 5 mm and larger than 0 mm.

In the present exemplary embodiment, the second display area DA2 may cover at least some of the outer surfaces of the second curved portions 133 and 135. For example, the second bending area (BA2_A) of the second display area DA2 may cover at least some of the outer surface of the second curved portion 133. In addition, the second bending area (BA2_B) of the second display area DA2 may cover at least some of the outer surface of the second curved portion 135.

The second support portion 130 may be made of the same material as the first support portion 110. For example, the second support portion 130 may be made of plastic, metal, wood, and the like.

Adhesive films may be interposed between the first display panel DP1 and the first support portion 110, and between the second display panel DP2 and the second support portion 130. The first display panel DP1 and the first support portion 110 may be attached to each other by the adhesive film, and the second display panel DP2 and the second support portion 130 may also be attached to each other by the adhesive film. In this case, the adhesive film may be formed as a double-sided adhesive tape.

The first rotation shaft X1 and the second rotation shaft X2 are parallel to each other, and may be rotatably coupled to a spacer 300. For example, as illustrated in FIG. 2, the first and second rotation shafts X1 and X2 may be spaced apart from each other inside the single spacer 300, e.g., to have a portion of the spacer 300 therebetween, and may rotate within the spacer 300. For example, as further illustrated in FIG. 2, the spacer 300 may extend from an internal portion of the first support portion 110 to an internal portion of the second support portion 130. For example, the spacer 300 may maintain a stationary position, e.g., unmovable and unstretchable, during rotation of the first and second display panels DP1 and DP2 around their respective rotation shafts. Therefore, the spacer 300 may maintain a constant distance between the first rotation shaft X1 and the second rotation shaft X2. Accordingly, when the first support portion 110 and the second support portion 130 respectively rotate based on the first rotation shaft X1 and the second rotation shaft X2 (along arrows of FIG. 3), it is possible to prevent the first display panel DP1 and the second display panel DP2 disposed on the first support portion 110 and the second support portion 130 from bumping against, e.g., contacting, each other during rotation, e.g., due to the constant distance maintained between the first and second rotation shafts X1 and X2 by the spacer 300.

Further, in the present exemplary embodiment, since the first display panel DP1 and the second display panel DP2 are, e.g., completely, separate from each other, and are respectively disposed on the separate first support portion 110 and the second support portion 130, as shown in FIG. 3, although the first support portion 110 and the second support portion 130 rotate, neither of the first display panel DP1 or the second display panel DP2 is individually folded or bent during the rotation. Accordingly, it is possible to prevent the display panel from being damaged due to stress occurring in the case that the first display panel DP1 and the second display panel DP2 are folded or bent.

Hereinafter, disposition relationships among the first bending area (BA1_A), the first curved portion 113, the second bending area (BA2_B), and the second curved portion 135 will be described with reference to FIG. 4 to FIG. 8. Moreover, a distance between the first display panel DP1 and the second display panel DP2 according to the disposition relationships will be described.

Figure 4:
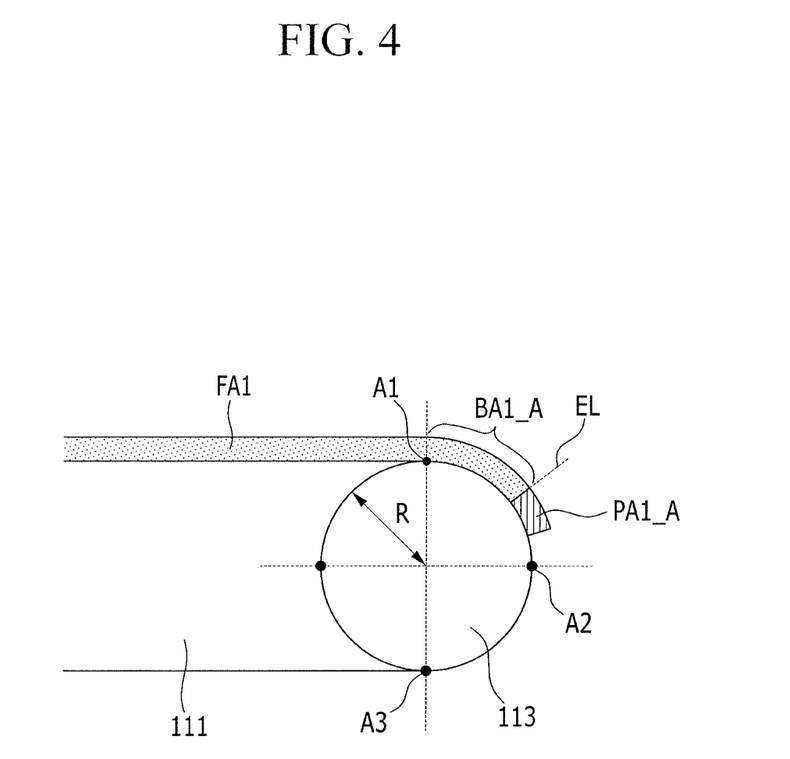
FIG. 4 illustrates a disposition relationship between a bending area and a curved portion of a display panel.

FIG. 4 illustrates a disposition relationship between the bending area and the curved portion of the display panel, and FIGS. 5 to 8 illustrate a distance between the first display panel DP1 and the second display panel DP2 according to a distance between the first support portion 110 and the second support portion 130.

Referring to FIG. 4, an end portion of the first bending area (BA1_A) may be disposed on the outer surface of the first curved portion 113. In detail, an imaginary border line (EL) which is formed by, e.g., defined between, the first bending area (BA1_A) and the first peripheral area (PA1_A) contacting each other may be disposed on the outer surface of the first curved portion 113. In this case, an end portion of the second bending area (BA2_B) is disposed on the outer surface of the second curved portion 135 to correspond to the first bending area (BA1_A).

In the present exemplary embodiment, the imaginary border line (EL) may be positioned between a point A1 and a point A2 of FIG. 4, or may be positioned between the point A2 and a point A3. Here, the point A1 indicates a 12 o'clock point of a semi-circular shaped first curved portion 113 of FIG. 4, the point A2 indicates a 3 o'clock point, and the point A3 indicates a 6 o'clock point.

Figure 5:
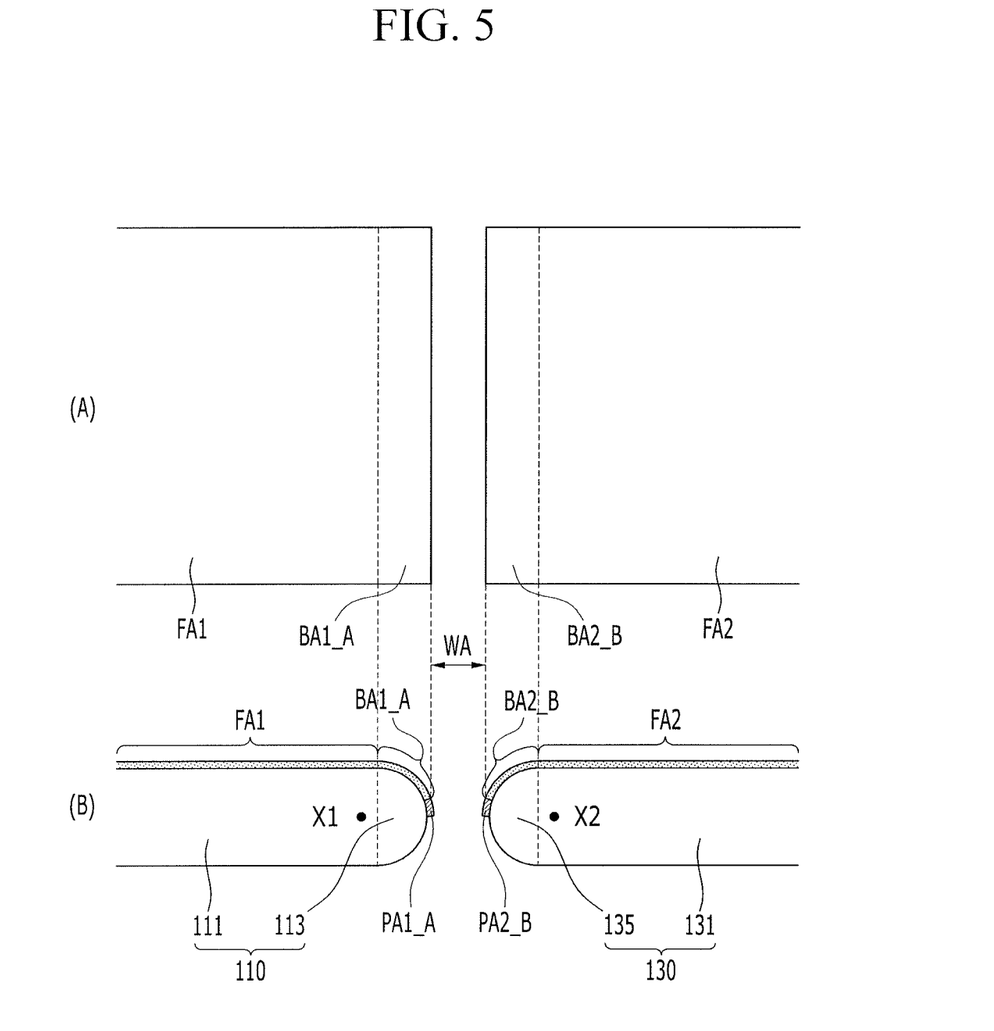
FIGS. 5 to 8 illustrate a distance between a first display panel and a second display panel according to a distance between the first support portion and the second support portion.

In the case that the imaginary border line (EL) of the first bending area (BA1_A) is disposed between the point A1 and the point A2, when viewed from a plane as shown in FIG. 5, the first bending area (BA1_A) and the second bending area (BA2_B) may be spaced apart from each other by a predetermined distance (WA). In this case, the distance (WA) may be equal to or less than 2 mm but larger than 0 mm.

When the first support portion 110 and the second support portion 130 respectively rotate based on the first rotation shaft X1 and the second rotation shaft X2, the first bending area (BA1_A) disposed on the first curved portion 113 and the second bending area (BA2_B) disposed on the second curved portion 135 are disposed within the predetermined distance (WA) therebetween, so the first bending area (BA1_A) and the second bending area (BA2_B) may not bump against each other.

Figure 6:
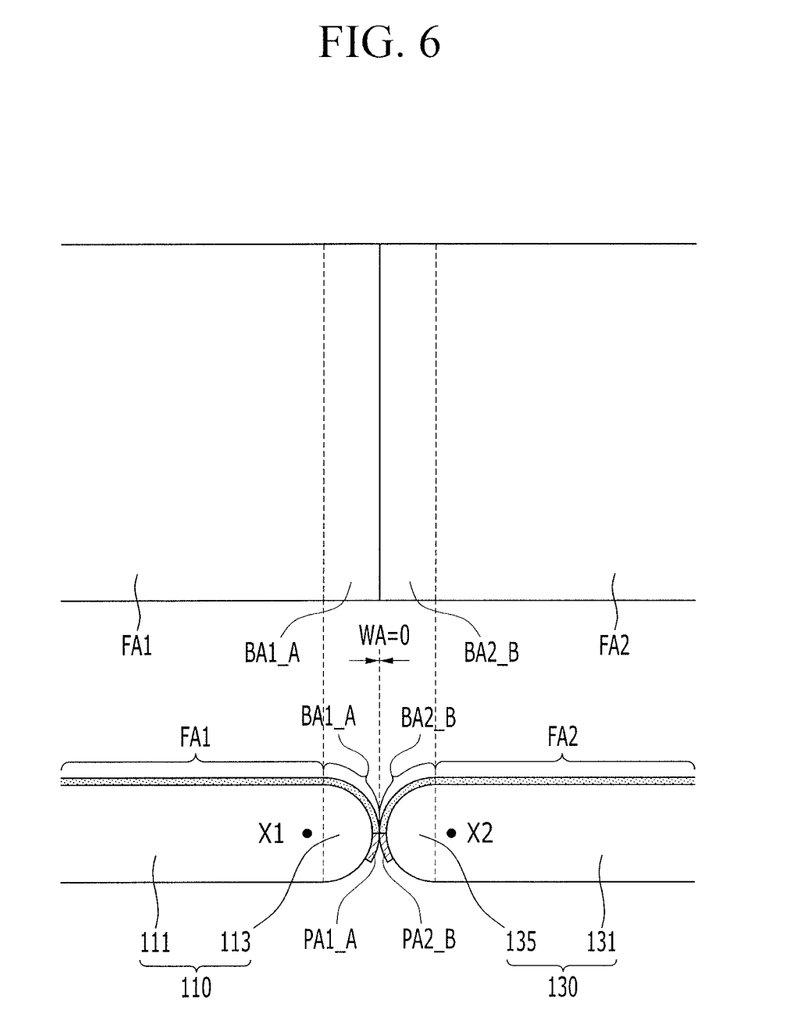
Figure 7:
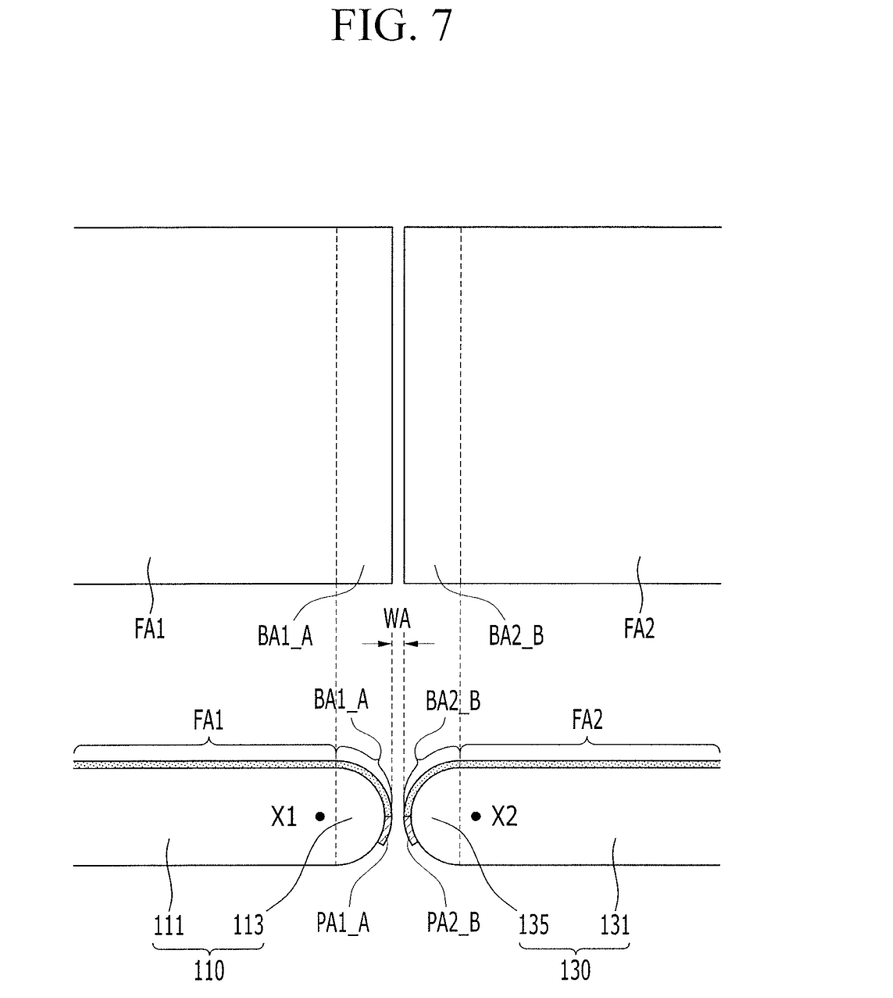

In the case that the imaginary border line (EL) of the first bending area (BA1_A) is disposed at the point A2, when viewed from a plane as shown in FIG. 6, the first bending area (BA1_A) and the second bending area (BA2_B) may contact each other. That is, the distance (WA) between the first bending area (BA1_A) and the second bending area (BA2_B) may be about 0 mm. However, the present disclosure is not limited thereto, and in order to prevent the first bending area (BA1_A) and the second bending area (BA2_B) from bumping against each other due to the rotation of the first support portion 110 and the second support portion 130, the first bending area (BA1_A) and the second bending area (BA2_B) may be disposed to be spaced apart from each other by a predetermined distance (WA), as shown in FIG. 7. In this case, the distance (WA) may be equal to or less than 2 mm but larger than 0 mm.

Figure 8:
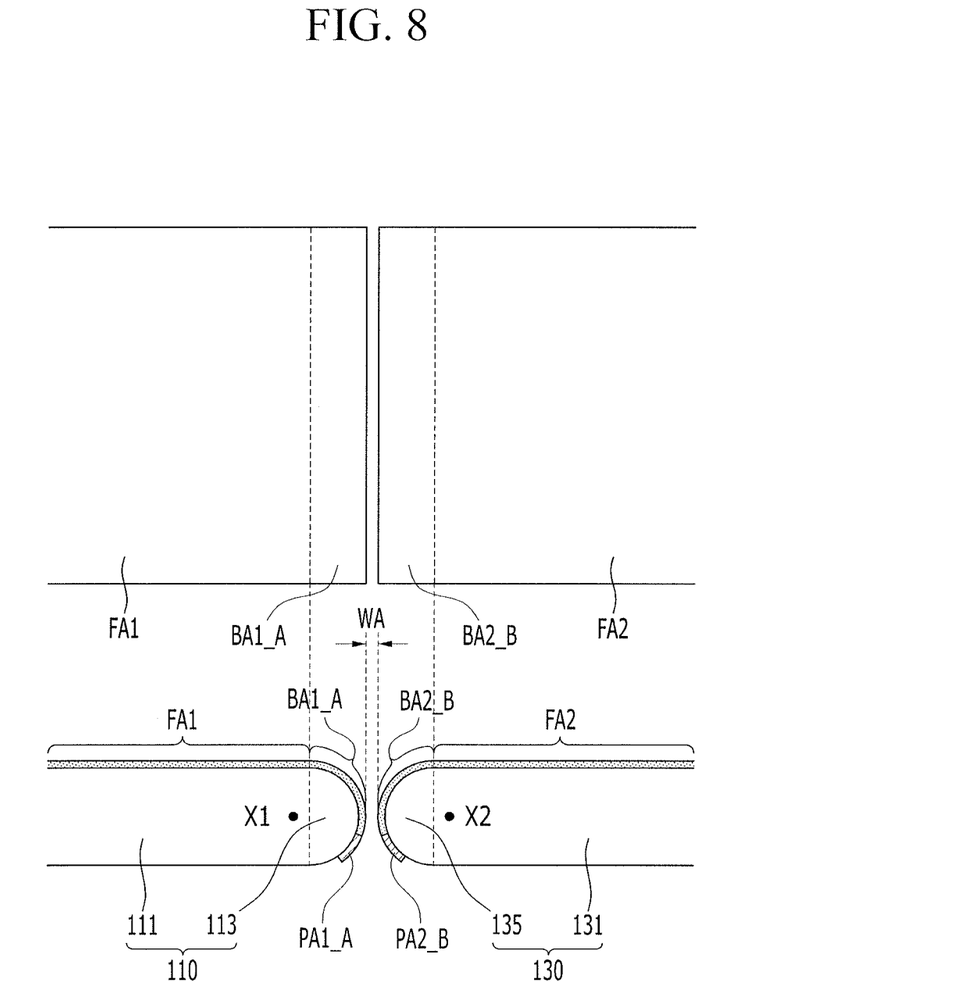

In the case that the border line (EL) of the first bending area (BA1_A) is disposed between the points A2 and A3, when viewed from a plane, the first bending area (BA1_A) and the second bending area (BA2_B) may contact each other. That is, the distance (WA) between the first bending area (BA1_A) and the second bending area (BA2_B) may be about 0 mm. However, the present disclosure is not limited thereto, and in order to prevent the first bending area (BA1_A) and the second bending area (BA2_B) from bumping against each other due to the rotation of the first support portion 110 and the second support portion 130, the first bending area (BA1_A) and the second bending area (BA2_B) may be disposed to be spaced apart from each other by a predetermined distance (WA), as shown in FIG. 8. In this case, the distance (WA) may be equal to or less than 2 mm but larger than 0 mm.

Hereinafter, a display device according to another exemplary embodiment will be described in detail with reference to FIG. 9 to FIG. 11. In the description of another exemplary embodiment, configurations that are the same as those of the above-described exemplary embodiment may not be further described.

Figure 9:
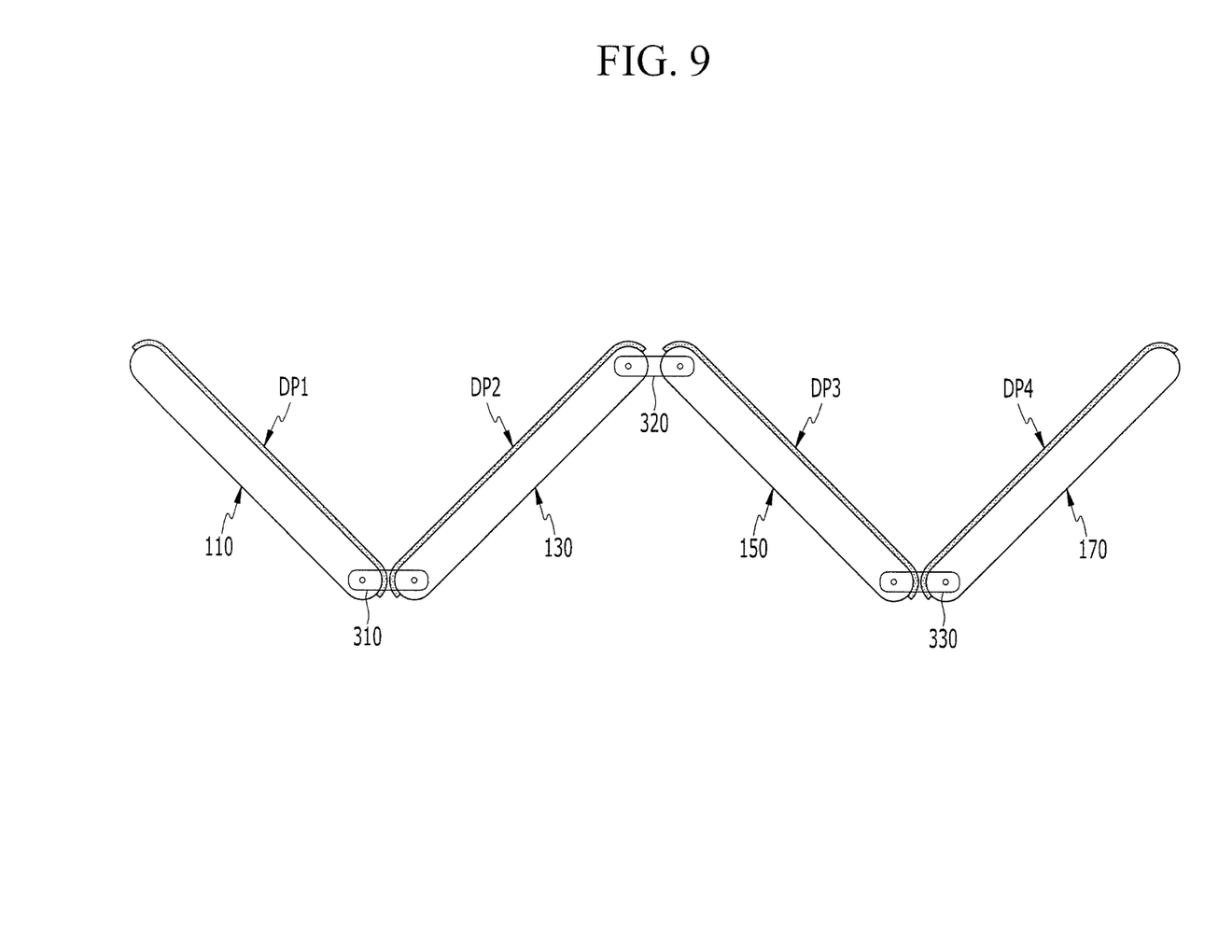
FIGS. 9 to 11 illustrate a display device according to another exemplary embodiment.
Figure 10:
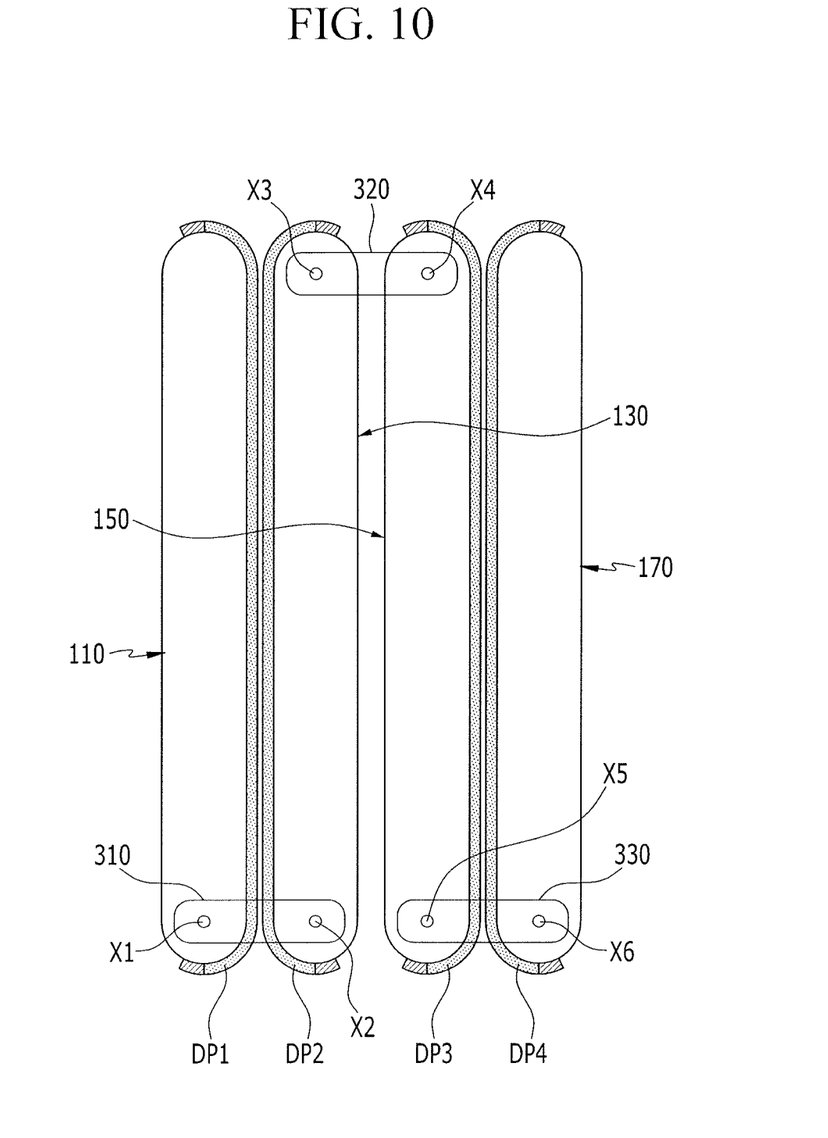
Figure 11:
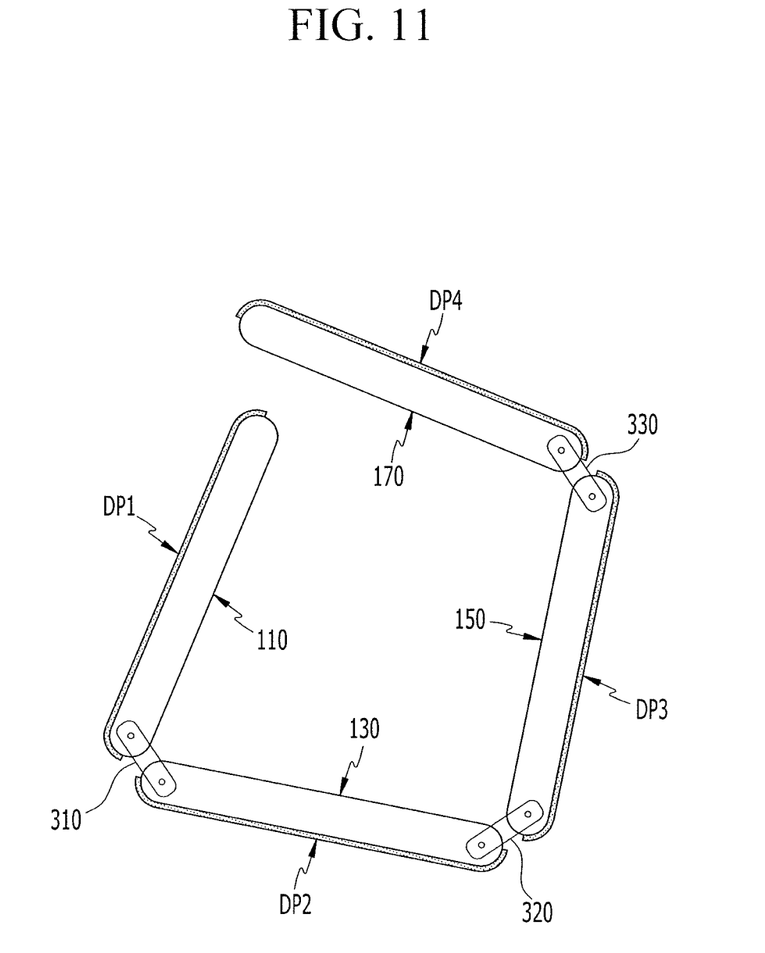

FIGS. 9 to 11 illustrate a display device according to another exemplary embodiment.

Referring to FIG. 9, a display device of the present exemplary embodiment includes four support portions (110, 130, 150, 170) and four display panels (DP1, DP2, DP3, DP4). The first display panel DP1 is disposed on the first support portion 110, and the second display panel DP2 is disposed on the second support portion 130. The third display panel DP3 is disposed on the third support portion 150, and the fourth display panel DP4 is disposed on the fourth support portion 170. The display device described with reference to FIG. 2 and FIG. 3 includes a pair of support portions, i.e., the first support portion 110 and the second support portion 130, while the display device of FIG. 9 to FIG. 11 may include four support portions (110, 130, 150, 170). However, the present disclosure is not limited thereto, and the display device may include three support portions, five support portions, six support portions, or seven or more support portions.

A distance between end portions of the first support portion 110 and the second support portion 130 that face each other may be constantly maintained by a first spacer 310, and a distance between end portions of the second support portion 130 and the third support portion 150 that face each other may be constantly maintained by a second spacer 320. Further, a distance between end portions of the third support portion 150 and the fourth support portion 170 that face each other may be constantly maintained by a third spacer 330.

The second support portion 130 and the third support portion 150 may respectively rotate based on a third rotation shaft X3 and a fourth rotation shaft X4 parallel to each other. Further, the third support portion 150 and the fourth support portion 170 may respectively rotate based on a fifth rotation shaft X5 and a sixth rotation shaft X6 parallel to each other.

In this case, when the first to fourth support portions (110, 130, 150, 170) are spread in series, the first to fourth display panels (DP1, DP2, DP3, DP4) may be used as one display device. As shown in FIG. 10, when the display device is not used, the first to fourth support portions (110, 130, 150, 170) are folded so that adjacent support portions face each other and then stored. However, the present disclosure is not limited thereto, and as shown in FIG. 11, the display device may be rolled and then stored. Alternatively, a pair of adjacent support portions of the first to fourth support portions (110, 130, 150, 170) may be disposed to have a predetermined angle, such that the display device may be used as a folding screen.

By way of summation and review, a display panel in a foldable display device that can be folded/unfolded or in a rollable display device that can be rolled may be broken or damaged during folding or rolling. Therefore, embodiments provide a display device that may prevent a display panel thereof from being broken or damaged due to stress.

For example, according to the display device of the exemplary embodiment, the first display panel DP1 and the second display panel DP2, which are included in a same display device, are respectively and separately disposed on the first support portion 110 and the second support portion 130. Although the first support portion 110 and second support portion 130 rotate based on respective first and second rotation shafts, which are parallel to each other, stress occurring when the first display panel DP1 and the second display panel DP2 are folded or bent may be suppressed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A display device, comprising:
   a first display panel including a first display area to display an image;
   a second display panel including a second display area to display an image;
   a third display panel including a third display area to display an image;
   a first support portion to support the first display panel, the first support portion including a first flat portion which has a first upper outer surface and a first lower outer surface, the first support portion including a first curved end portion that is formed to be convex in a rightward direction from the first upper outer surface and the first lower outer surface, and the first support portion being rotatable based on a first rotation shaft;
   a second support portion to support the second display panel, the second support portion including a second flat portion which has a second upper outer surface and a second lower outer surface, the second support portion including a second curved end portion that faces the first curved end portion and is formed to be convex in a leftward direction from the second upper outer surface and the second lower outer surface, and the second support portion being rotatable based on a second rotation shaft parallel to the first rotation shaft,
   a third support portion to support the third display panel, the third support portion including a third flat portion which has a third upper outer surface and a third lower outer surface, the third support portion including a fourth curved end portion that is formed to be convex in a leftward direction from the third upper outer surface and the third lower outer surface and to face a third curved end portion of the second support portion disposed opposite to the second curved end portion of the second support portion, the third curved end portion being formed to be convex in a rightward direction from the second upper outer surface and the second lower outer surface, and the third support portion being rotatable based on a fourth rotation shaft parallel to a third rotation shaft,
   wherein
      the first display area of the first display panel is disposed on an outer surface of the first curved end portion of the first support portion,
      the second display area of the second display panel is disposed on an outer surface of the second curved end portion of the second support portion and an outer surface of the third curved end portion of the second support portion, the third rotation shaft is at the second support portion to be parallel to the second rotation shaft, and the third display area of the third display panel is disposed on an outer surface of the fourth curved end portion of the third support portion.

2. The display device as claimed in claim 1, wherein:

the first curved end portion extends from the first flat portion of the first support portion at a first side of the first flat portion, and the first display area covers the first upper outer surface of the first flat portion and the outer surface of the first curved end portion.

3. The display device as claimed in claim 2, wherein the first display area covers a half of or less than a total outer surface of the first curved end portion.

4. The display device as claimed in claim 2, wherein:

the first display panel includes a first peripheral area around the first display area, and the first peripheral area includes a plurality of first signal lines to transmit a signal to the first display area.

5. The display device as claimed in claim 2, wherein:

the second curved end portion extends from the second flat portion of the second support portion at a first side of the second flat portion, and the second display area covers the second upper outer surface of the second flat portion and the outer surface of the second curved end portion.

6. The display device as claimed in claim 5, wherein the second display area covers a half of or less than a total outer surface of the second curved end portion.

7. The display device as claimed in claim 5, wherein:

the second display panel includes a second peripheral area around the second display area, and the second peripheral area includes a plurality of second signal lines to transmit a signal to the second display area.

8. The display device as claimed in claim 5, wherein the outer surfaces of the first curved end portion and the second curved end portion are curved to have a predetermined curvature radius.

9. The display device as claimed in claim 8, wherein the curvature radius is equal to or less than 5 mm and more than 0 mm.

10. The display device as claimed in claim 1, wherein, when viewed from a top plane, a distance between the first display area and the second display area is equal to or less than about 2 mm.

11. The display device as claimed in claim 1, wherein each thickness of the first display panel and the second display panel is about 0.1 mm to about 1 mm.

12. The display device as claimed in claim 1, further comprising a spacer coupled to the first rotation shaft and the second rotation shaft, the spacer to maintain a constant distance between the first rotation shaft and the second rotation shaft.

13. The display device as claimed in claim 12, wherein the spacer is on a lateral surface of each of the first support portion and the second support portion.

14. The display device as claimed in claim 1, further comprising an adhesive film between the first display panel and the first support portion, and between the second display panel and the second support portion.

15. The display device as claimed in claim 14, wherein the adhesive film is a double-sided adhesive tape.

16. The display device as claimed in claim 1, further comprising:

a fourth display panel including a fourth display area to display an image; and a fourth support portion to support the fourth display panel, the fourth support portion including a fourth flat portion which has a fourth upper outer surface and a fourth lower outer surface, the fourth support portion including a sixth curved end portion that is formed to be convex in a leftward direction from the fourth upper outer surface and the fourth lower outer surface and to face a fifth curved end portion of the third support portion disposed opposite to the fourth curved end portion of the third support portion, the fifth curved end portion being formed to be convex in a rightward direction from the third upper outer surface and the third lower outer surface, and the fourth support portion being rotatable based on a sixth rotation shaft parallel to a fifth rotation shaft, wherein the fifth rotation shaft is at the third support portion to be parallel to the fourth rotation shaft, the third display area of the third display panel is disposed on an outer surface of the fifth curved end portion of the third support portion, and the fourth display area of the fourth display panel is disposed on an outer surface of the sixth curved end portion of the fourth support portion.

17. The display device as claimed in claim 1, wherein the first and second display panels are separate from each other.

18. The display device as claimed in claim 17, wherein the first and second support portions are rotatable independently of each other.

19. The display device as claimed in claim 17, wherein, during rotation of the first and second support portions, the first and second display panel do not contact each other.

* * * * *